United States Patent
Jeng

(10) Patent No.: US 7,805,692 B2
(45) Date of Patent: Sep. 28, 2010

(54) METHOD FOR LOCAL HOT SPOT FIXING

(75) Inventor: Shwang-Ming Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 528 days.

(21) Appl. No.: 11/748,599

(22) Filed: May 15, 2007

(65) Prior Publication Data

US 2007/0264731 A1 Nov. 15, 2007

Related U.S. Application Data

(60) Provisional application No. 60/800,526, filed on May 15, 2006.

(51) Int. Cl.
  *G06F 17/50* (2006.01)
(52) U.S. Cl. .................................. 716/4; 716/2; 716/5
(58) Field of Classification Search ..................... 716/1, 716/4, 5, 2
  See application file for complete search history.

(56) References Cited

U.S. PATENT DOCUMENTS

| | | | |
|---|---|---|---|
| 5,847,965 A | 12/1998 | Cheng | |
| 6,077,310 A | 6/2000 | Yamamoto et al. | |
| 6,408,219 B2 | 6/2002 | Lamey, Jr. et al. | |
| 7,363,207 B2 | 4/2008 | Kamon | |
| 7,570,796 B2 * | 8/2009 | Zafar et al. ................. | 382/144 |
| 2005/0044514 A1 | 2/2005 | Wu et al. | |
| 2005/0132306 A1 | 6/2005 | Smith et al. | |
| 2006/0026539 A1 | 2/2006 | Tetelbaum et al. | |
| 2006/0123380 A1 | 6/2006 | Ikeuchi | |
| 2007/0042513 A1* | 2/2007 | Nakasugi ..................... | 438/16 |
| 2007/0055892 A1 | 3/2007 | Pikus | |
| 2007/0156379 A1* | 7/2007 | Kulkarni et al. ............... | 703/14 |
| 2007/0201442 A1 | 8/2007 | Hekmatpour et al. | |
| 2007/0234246 A1 | 10/2007 | Sinha et al. | |
| 2007/0266356 A1 | 11/2007 | Chang et al. | |
| 2007/0266362 A1 | 11/2007 | Lai et al. | |

(Continued)

OTHER PUBLICATIONS

Charles Ouyang et al., An Analytical Model of Multiple ILD Thickness Variation Induced by Interaction of Layout Pattern and CMP Process, IEEE Transactions on Semiconductor Manufacturing, Aug. 2000, 7 pages.

(Continued)

*Primary Examiner*—Sun J Lin
(74) *Attorney, Agent, or Firm*—Haynes and Boone, LLP

(57) ABSTRACT

Efficient and cost-effective systems and methods for detecting and correcting hot spots of semiconductor devices are disclosed. In one aspect, a method includes providing an input file having a device layout; performing a hot spot detection on the input file; and then modifying the device layout based on the hot spots detected to create an output file. In another aspect, a method includes providing an input file having a device layout; selecting a first local region of the device layout; performing a first hot spot detection on the first local region; modifying the first local region based on the hot spots detected to create a first output file; and repeating for other local regions of the device layout. In some aspects, hot spots are detected by comparing parameters of the device layout with a set of hot spot rules to determine if the device layout satisfies the hot spot rules.

19 Claims, 7 Drawing Sheets

U.S. PATENT DOCUMENTS

2007/0288219 A1    12/2007    Zafar et al.

OTHER PUBLICATIONS

Chappell, Jeff, "The Future is the FOUP—Company Business and Marketing," Electronic News, Jul. 17, 2000, 2 pages.

Chen, Kuan-Chou, et al., "Integrated Circuits Industry / Front-Opening Unified Pod Audo-Loading Structure," Knowledge Bridge, No. 22, Apr. 2002, 4 pages.

Ottesen, Craig, "Front Opening Pod (FOUP) Fire Protection: A General Overview", Inteternational Sematech, Nov. 5, 1999, 10 pages.

Raghvendra, Srinivas, et al., "DFM: Linking Design and Manufacturing", Proceedings of the 18th International Conference on VLSI Design held jointly with 4th International Conference on Embedded Systems Design, VLSID, 2005, pp. 705-708.

Tsujikawa, Hiroyuki, et al., "Power-Supply Noise Reduction with Design for Manufacturability", IEICE Trans Fundamentals, vol. E88-A, No. 12, Dec. 2005, pp. 3421-3428.

* cited by examiner

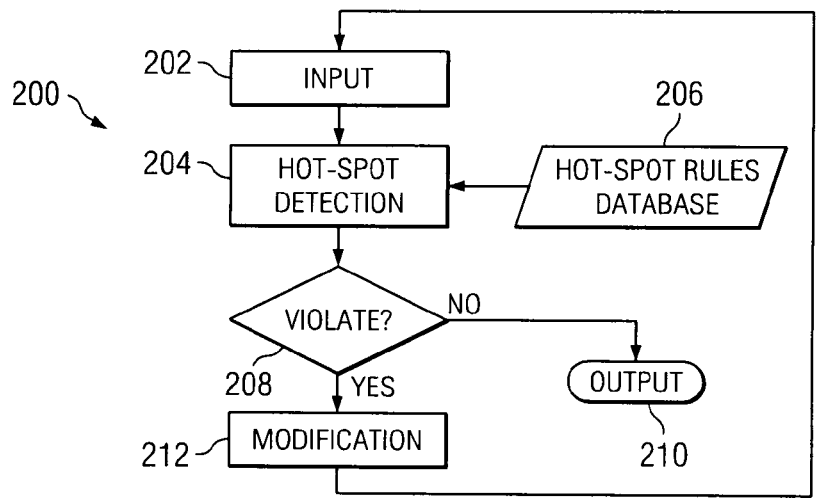
Fig. 7
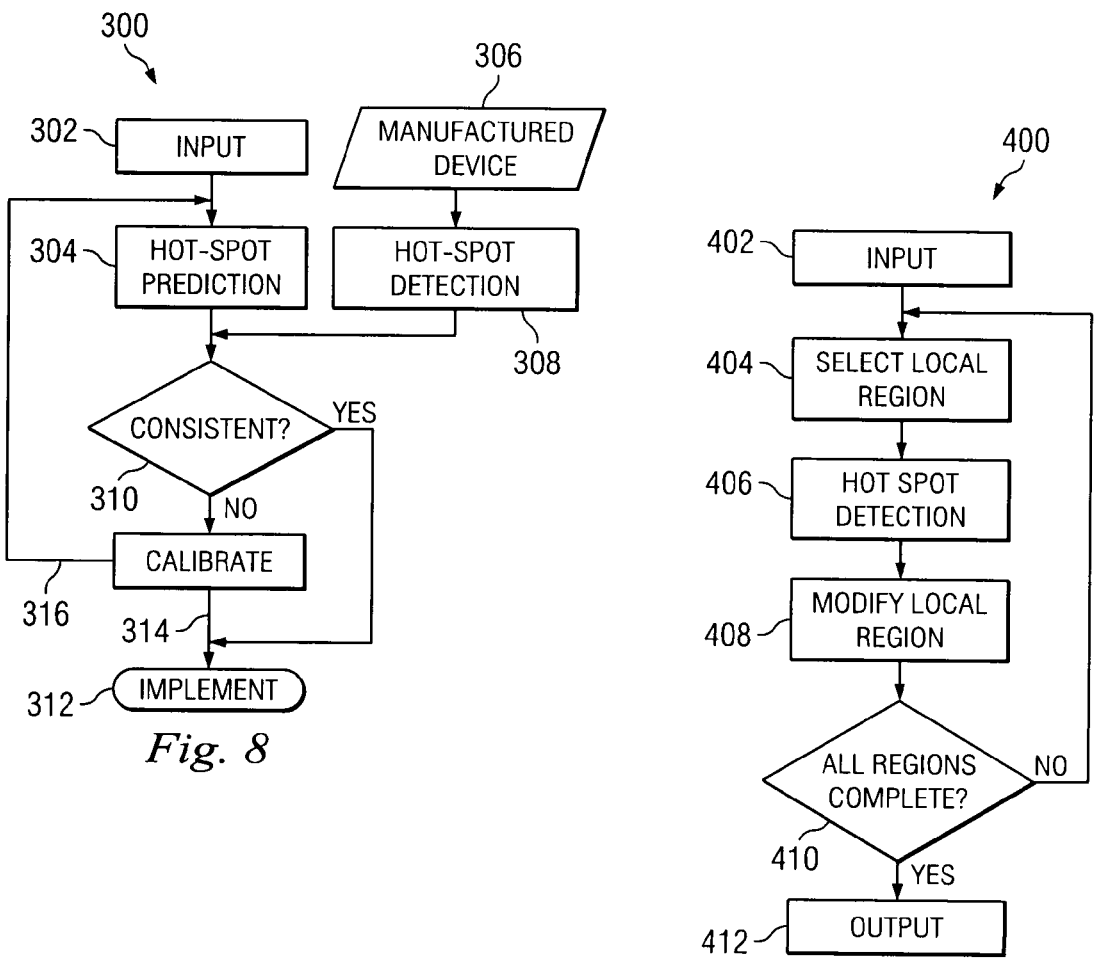
Fig. 8
Fig. 9

METHOD FOR LOCAL HOT SPOT FIXING

CROSS-REFERENCE

This application claims the benefit of U.S. Provisional Application 60/800,526 entitled "Design for Manufacturability," filed May 15, 2006, herein incorporated by reference in its entirety.

BACKGROUND

As semiconductor fabrication technologies are continually progressing to smaller feature sizes such as 65 nanometers, 45 nanometers, and below, simply scaling down similar designs used at the larger feature sizes often results in hot spots or problem areas in the device. Hot spots in this context refer to characteristics of the device that prevent the device from performing as desired. Examples of hot spots include pinching, bridging, dishing, erosion, RC delay, metal line thickness variations, Cu residue, and other characteristics that affect the desired device performance. These hot spots can be due to the circuit design and/or the process controls. Efficient and cost-effective systems and methods for detecting and correcting hot spots are needed. Although existing devices and methods have been generally adequate for their intended purposes, they have not been entirely satisfactory in all respects.

BRIEF DESCRIPTION OF THE DRAWINGS

FIG. 7 is a block diagram of an embodiment of a method according to one aspect of the present disclosure for detecting and correcting hot spots of a semiconductor device.

FIG. 8 is a block diagram of an embodiment of a method according to one aspect of the present disclosure for calibrating a system for detecting and correcting hot spots of a semiconductor device.

FIG. 9 is a block diagram of an embodiment of a method according to one aspect of the present disclosure for detecting and correcting hot spots of a semiconductor device.

DETAILED DESCRIPTION

Figure 1:
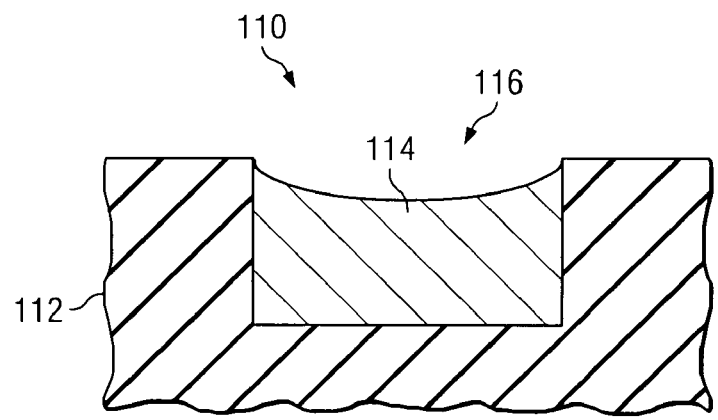
FIG. 1 is a cross-sectional view of a semiconductor wafer illustrating a dishing effect.

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

It is understood that the following disclosure provides many different embodiments, or examples, capable of implementing different features. Specific examples of components and arrangements are described below to simplify and thus clarify the present disclosure. These are, of course, merely examples and are not intended to be limiting. In many instances, the features of one embodiment may be combined with the features of other embodiments. In addition, the present disclosure may repeat reference numerals and/or letters in the various exemplary embodiments. This repetition is for the purpose of simplicity and clarity and does not in itself dictate a relationship between the various embodiments and/or configurations discussed.

As semiconductor fabrication technologies are continually progressing to smaller feature sizes such as 65 nanometers, 45 nanometers, and below, scaling down similar designs used at the larger feature sizes often results in hot spots or problem areas in the device. Hot spots in this context refer to characteristics of the device that prevent the device from performing as desired. Examples of hot spots include pinching, bridging, dishing, erosion, RC delay, metal line thickness variations, Cu residue, and other characteristics that affect the desired device performance. These hot spots can be due to the circuit design and/or the process controls.

A dual damascene process is often used in semiconductor fabrication when feature size is scaled down and technology moves to submicron levels. In the dual damascene process, copper or other conductive materials are generally used as conductive material for interconnection. Examples of other conductive materials include, but are not limited to tungsten, titanium, and titanium nitride. Also, silicon oxide, fluorinated silica glass, or other low dielectric constant (k) materials are used for inter-level dielectric (ILD) layers. Often a chemical mechanical polishing (CMP) technique is used to etch back and globally planarize the conductive material and/or ILD. However, because the removal rate of the metal and dielectric materials are often different, CMP can create undesirable dishing and/or erosion effects that result in hot spots. Dishing often occurs when the metal recedes below the level of the adjacent dielectric. Erosion is a localized thinning of the dielectric. Dishing and erosion are sensitive to pattern structure, pattern density, and processing.

Figure 2:
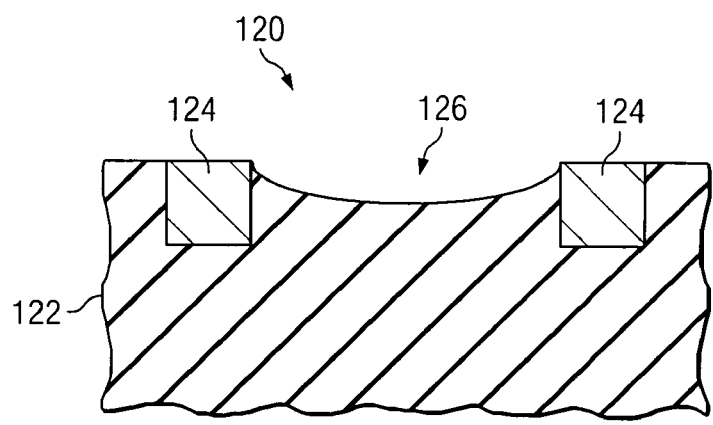
FIG. 2 is a cross-sectional view of a semiconductor wafer illustrating an erosion effect.

FIGS. 1-6 illustrate different exemplary hot spots. FIGS. 1 and 2 are cross-sectional views of two examples of dishing and erosion effects in a semiconductor wafer. Often such effects are caused by chemical mechanical polishing (CMP) or other semiconductor processing techniques. In some instances, dishing and erosion can result from the formation of an isolation structure such as shallow trench isolation (STI). In FIG. 1, a semiconductor device 110 includes a dielectric material 112 and a metal 114. In a planarizing process, such as CMP, when the removal rate of a metal feature is higher than that of a dielectric feature the resulting dip or deviation from a substantially planar surface profile is referred to as dishing. The device 110 exhibits a dishing effect 116 because the metal 114 has a higher polishing rate than that of the dielectric material 112. In the current embodiment, the metal 114 may include copper, tungsten, titanium, titanium nitride, tantalum, tantalum nitride, other metals and/or combinations thereof. Also, the dielectric material 112 may include silicon oxide, fluorinated silica glass (FSG), low k materials, and/or combinations thereof. The dielectric 112 and the metal 114 may be part of an interconnection structure in a integrated semiconductor circuit and may be fabricated by dual damascene processing including multiple processes such as deposition, etching, and CMP.

In FIG. 2, a semiconductor device 120 includes a dielectric material 122 and a metal 124. In a planarizing process, such as CMP, when the removal rate of a dielectric layer is higher than that of a metal feature, the resulting dip or deviation from a substantially planar surface profile is referred to as erosion. The device 120 exhibits an erosion effect 126 because the dielectric material 122 has a higher polishing rate than that of the metal 124.

Figure 3:
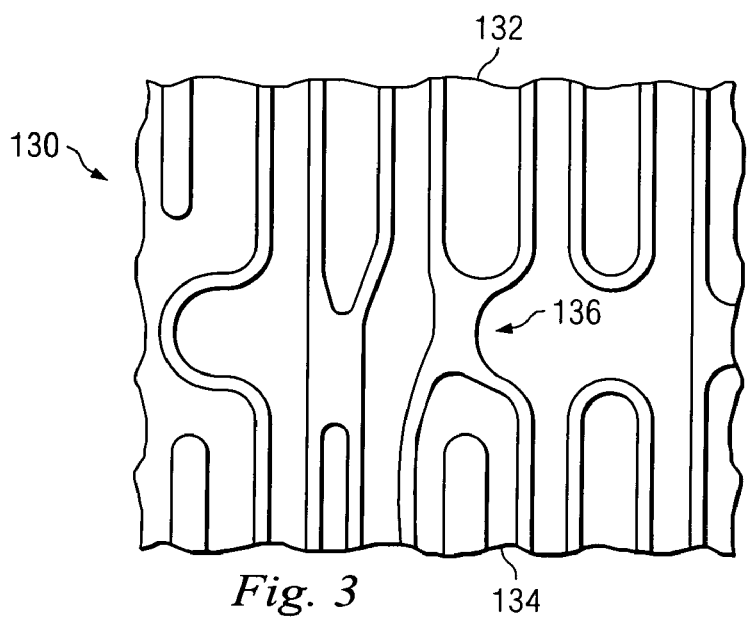
FIG. 3 is a top-down view a semiconductor wafer illustrating a bridging effect.
Figure 4:
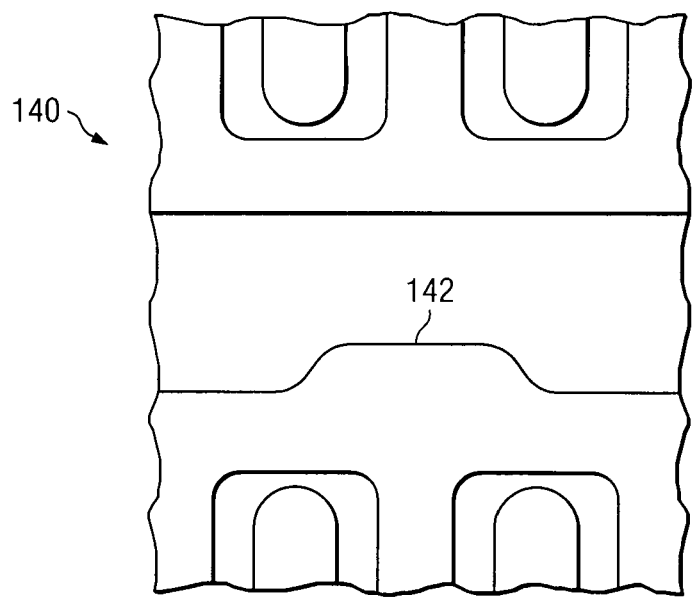
FIG. 4 is a top-down view a semiconductor wafer illustrating a bridging effect.

FIGS. 3 and 4 are top-down views of two examples of bridging effects in a semiconductor wafer. In FIG. 3, a semiconductor device 130 includes a metal line 132 and a metal line 134. The device 130 exhibits a bridging effect 136 between the metal lines 132 and 134. In FIG. 4, a semiconductor device 140 exhibits a line-end bridging effect 142. The bridging effects 136 and 142 may be caused by numerous factors including, but not limited to layout design, processing controls, inadequate line spacing, dishing, erosion, metal line thickness variations, and/or the presence of Cu residue.

Figure 5:
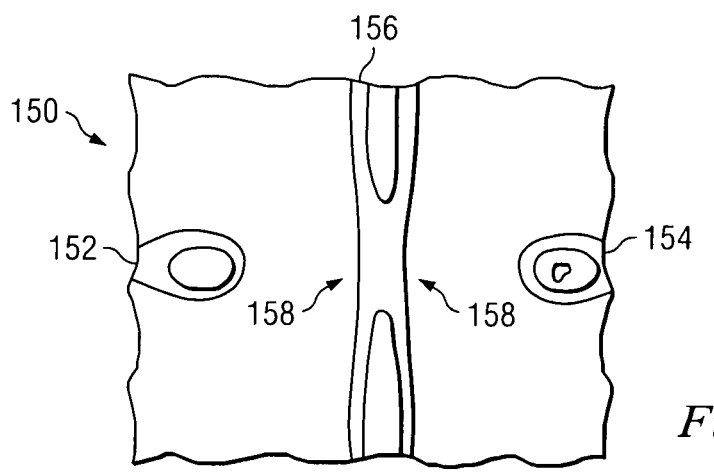
FIG. 5 is a top-down view a semiconductor wafer illustrating a pinching effect.
Figure 6:
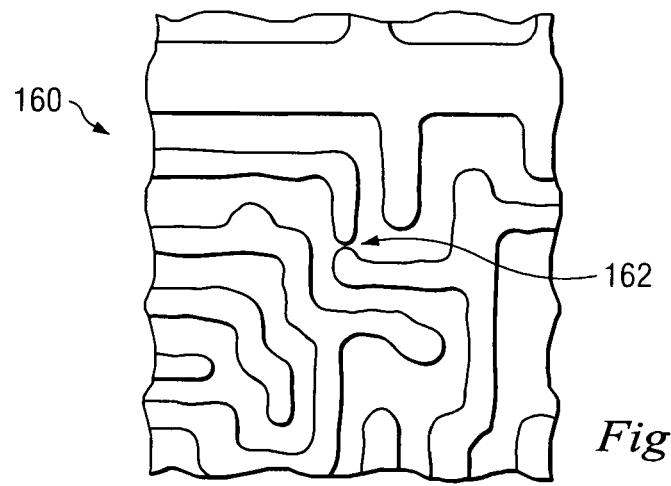
FIG. 6 is a top-down view a semiconductor wafer illustrating a pinching effect.

FIGS. 5 and 6 are top-down views of two examples of pinching effects in a semiconductor wafer. In FIG. 5, a semiconductor device 150 includes metals line 152 and 154 on either side of a metal line 156. The device 150 exhibits a pinching effect 158 along the metal line 156 between the metal lines 152 and 154. In FIG. 6, a semiconductor device 160 exhibits a pinching effect 162. The pinching effects 158 and 162 may be caused by numerous factors including, but not limited to layout design, processing controls, inadequate line spacing, dishing, erosion, metal line thickness variations, and/or the presence of Cu residue.

The semiconductor devices 110, 120, 130, 140, 150, and 160 may also include electric circuits and a semiconductor substrate. The electric circuits may include metal oxide semiconductor filed effect transistors (MOSFET), bipolar transistors, diodes, memory cells, resistors, capacitors, inductors, high voltage transistors, sensors, or combinations thereof. The semiconductor substrate may comprise an elementary semiconductor (such as crystal silicon, polycrystalline silicon, amorphous silicon and germanium), a compound semiconductor (such as silicon carbide and gallium arsenic), an alloy semiconductor (such as silicon germanium, gallium arsenide phosphide, aluminum indium arsenide, aluminum gallium arsenide and gallium indium phosphide) and/or combinations thereof. The semiconductor substrate may be a semiconductor on insulator (SOI), having a buried oxide (BOX) structure. In other examples, the compound semiconductor substrate may include a multiple silicon structure, or the silicon substrate may include a multilayer compound semiconductor structure.

In some embodiments, the present disclosure is directed towards a system and method for identifying and correcting hot spots of a semiconductor device, including hot spots caused by dishing, erosion, bridging, and pinching, as described above, and other hot spots. In particular, in some embodiments the system and method are adapted to reduce the cost and time required to produce a semiconductor device with the desired properties by identifying and correcting hot spots during the design and simulation phases, rather than after wafer processing. Some embodiments of the system and method are for use in design for manufacture (DFM) applications. Further, in some embodiments the methods of the present disclosure are performed by a router system.

FIG. 7 is a block diagram of an embodiment of a method 200 according to one aspect of the present disclosure for detecting and correcting hot spots of a semiconductor device. The method 200 begins with step 202 in which an input file is provided. The input file is a circuit layout or chip design and in some embodiments is retrieved from a design database. The circuit layout is provided in a computer aided design format, such as GDS II format. In some embodiments, the circuit layout is generated by a virtual process simulator, such as a VCMP or other process simulation tool. Further, the layout may be created by using several process simulators, such as ECP model, a CMP model, and an etching model. Other combinations of simulators may be used as well. Typically, the circuit layout includes a plurality of metal layers. Each metal layer includes metal interconnects disposed in a dielectric layer. The metal layers of the circuit layout are divided into a plurality of regions (also known as cells, grids, or tiles). It is understood that the number of regions can vary depending on the technology and the complexity of the circuit design. In this regard, the methods described herein may be used on a single layer, a plurality of layers, and/or all of the layers of a chip design. In addition, the methods described herein may be used for detecting hot spots due to the interaction between the layers and/or the processes used to manufacture the device, such as ECP, CMP, and etching, for example.

The method 200 continues with step 204 in which a hot spot detector performs a hot spot detection on the input file. The hot spot detector is a software tool that determines whether the circuit layout of the input file complies with a set of hot spot rules. The hot spot detector compares the parameters of the circuit layout of the input file with a plurality of hot spot rules and/or specifications from the hot spot rule database 206. The hot spot detector may compare the design layout as a whole and/or compare individual regions of the design layout one at a time until all regions have been compared to the hot spot rules/specifications. For the sake of example, one such rule is a minimum density rule for interconnects in the metal layer. Each region of the metal layer has a local density associated with it. The local density for a given region is the total area of the interconnects located in the region divided by the total area of that region. The minimum density rule requires that each region have a local density equal to or greater than a minimum density value. Thus, the hot spot detector compares the local density of each region with the minimum density value to determine compliance with the rule. Several other exemplary rules will be discussed below, but by no means provide an exhaustive list of the possible hot spot rules.

It is understood that use of the term hot spot detector is intended to include software applications that can be implemented by various programming languages to determine the existence of hot spots within a particular pattern layout based on a set of hot spot rules. It is also understood that the hot spot rules may be stored in database accessible by the hot spot detector and/or may be part of the hot spot detector program itself. The hot spot rules may be organized based on processing type, layout designs, feature sizes, and/or other appropriate groupings. In some embodiments, the hot spot rules are predefined. Further, in some embodiments the hot spot rules are definable and/or additional hot spot rules can be added to and/or removed from the set of hot spot rules.

The method 200 continues with step 208 in which the hot spot detector determines whether the input file violates one of the plurality of hot spot rules. Continuing the example of the minimum density rule from above, if the hot spot detector determines that the local density of each region of the input file satisfies the minimum density value and all other hot spot rules, then the method 200 continues to step 210 in which an output file is output by the system. The output file is a revised circuit layout that may be provided in a computer aided design format, such as GDS II format. In some embodiments, the output is in the same format as the input file. Thus, the output file may be generated by a virtual process simulator, such as a VCMP or other process simulation tool. Further, the output file may be created by using several process simulators, such as ECP model, a CMP model, and an etching model and/or other combinations.

The output file is optimized for device manufacture as it does not violate any of the hot spot rules. In some embodiments, the output file is subjected to further rule-based testing or otherwise modified or tested to further improve the design and/or layout of the device before the manufacturing phase. On the other hand, if the hot spot detector determines that the local density of a region of the input file violates the minimum density value, then the method 200 continues to step 212 in which the input file is modified in an attempt to avoid violation of the minimum density value and/or any of the other hot spot rules. In some embodiments, the modification is based on a set of guidance parameters and/or rules based on the hot spot rule that was violated. The suggested modifications based on the guidance parameters may be made to the input file by a computer system or program and/or directly by a user. When the modifications are made by a user, the user may manually direct the changes through a computer system/program. Where the modifications are made by a computer system/program, the guidance parameters may be stored in database accessible by computer system/program. Similarly, where the modifications are made by a user, the guidance parameters may be stored in human intelligible form accessible by user. In some embodiments, the system will suggest a modified device layout based on the guidance parameters, which the user may then make additional changes to in an effort to achieve the optimum layout design.

After the modifications have been made, then the method continues with step 202 at which a second input file is provided to the system based on the guidance parameters. Again, the input file is a circuit layout or chip design and in some embodiments is retrieved from a design database. The circuit layout is provided in a computer aided design format, such as GDS II format. In some embodiments, the circuit layout is generated by a virtual process simulator, such as a VCMP or other process simulation tool. After the modified input file is provided the method 200 continues through steps 204, 208, and 212 until the input file does not violate any of the hot spot rules. This iterative process continues until the input file does not violate any of the hot spot rules, at which point the method continues with step 210 where an output file is output by the system as described above. Again, the output file is optimized for device manufacture as it does not violate any of the hot spot rules. However, in some embodiments the output file is subjected to further rule-based testing or otherwise modified or tested to further improve the design and/or layout of the device before the manufacturing phase.

In some embodiments, the present disclosure is directed towards a system and method for calibrating a hot spot detection and correction system. For example, systems and methods for identifying and correcting hot spots of a semiconductor device, including hot spots caused by dishing, erosion, bridging, pinching, and other hot spots are disclosed. In particular, these system and method are adapted to reduce the cost and time required to produce a semiconductor device with the desired properties by identifying and correcting hot spots during the design and simulation phases, rather than after wafer processing. Some embodiments of the system and method are for use in design for manufacture (DFM) applications. However, if the systems and methods are not properly calibrated, then they will not provide the accurate and/or precise data necessary to identify and correct the hot spots. Again, the methods described herein may be used on a single layer, a plurality of layers, and/or all of the layers of a chip design. In addition, the methods described herein may be used for detecting hot spots due to the interaction between the layers and/or the processes used to manufacture the device, such as ECP, CMP, and etching, for example.

FIG. 8 is a block diagram of an embodiment of a method 300 according to one aspect of the present disclosure for calibrating a system for detecting and correcting hot spots of a semiconductor device. The method 300 begins with step 302 in which an input file is provided. The input file is a circuit layout or chip design and in some embodiments is retrieved from a design database. The circuit layout is provided in a computer aided design format, such as GDS II format. In some embodiments, the circuit layout is generated by a virtual process simulator, such as a VCMP or other process simulation tool. Typically, the circuit layout includes a plurality of metal layers. Each metal layer includes metal interconnects disposed in a dielectric layer. The metal layers of the circuit layout are divided into a plurality of regions (also known as cells, grids, or tiles). It is understood that the number of regions can vary depending on the technology and the complexity of the circuit design.

The method 300 continues with step 304 in which a hot spot detector performs a hot spot prediction/detection on the input file. The hot spot detector is a software tool that determines the location and parameters of potential hot spots including both physical and electrical hot spots. For the sake of example, one such physical parameter is the size of a surface variation that may result in a hot spot. Such surface variations may be caused by such things as dishing, erosion, or otherwise result from the processing of the device. Thus, continuing the example, the hot spot detector may indicate that a certain region of the device may have a 15 mm surface variation. Surface variations are merely one example of a physical hot spot parameter that may be used by the hot spot detector. For the sake of example, one electrical parameter is the predicted RC characteristics of a design. Several other exemplary rules will be discussed below, but by no means provide an exhaustive list of the possible hot spot rules and parameters that may be utilized. In some embodiments, the hot spot detector determines the location and parameter of a hot spot by comparing the circuit layout of the input file to a set of hot spot rules. The hot spot detector compares the parameters of the circuit layout of the input file with a plurality of hot spot rules and/or specifications from the hot spot rule database. The hot spot detector may compare the design layout as a whole and/or compare individual regions of the design layout one at a time until all regions have been compared to the hot spot rules/specifications.

The method 300 continues with step 306 in which an actual device is manufactured according to the design layout of the input file. The device may be manufactured as test wafer, a production wafer, formed on the streets of a wafer, or otherwise manufactured. In some embodiments, the device is manufactured on the production lines and/or processing lines that the devices will be manufactured on. The method continues with step 308 in which the manufactured device is subjected to a hot spot analysis to detect hot spots on the device. Various types of analysis may be utilized in order to detect hot spots including, but not limited to, electron microscopy, scanning electron microscopy (SEM), scanning tunneling microscopy (STM), transmission electron microscopy (TEM), atomic force microscopy (AFM), other methods, and combinations thereof. For example, continuing the surface variation example from above, the device may be analyzed using AFM to detect undesired surface variations indicative of a hot spot. Further, the accuracy of the AFM profile may be verified by comparing the AFM profile to SEM and/or TEM profiles. Similarly, the electrical characteristics, such as RC, of the actual device are determined as well.

The method continues at step 310 where the hot spot prediction of the input file is compared to the hot spot detection of the actual device to determine whether the hot spot detector is consistent with the actual processing. If the hot spot prediction of the input file is consistent with the hot spot detection of the actual device, then the method continues at step 312 with implementation of the hot spot detection and correction system. That is, if the hot spot detector is consistent with the actual results of the processing techniques, then the system is used for detecting and correcting hot spots in circuit design layouts. However, if the hot spot prediction of the input file is inconsistent with the hot spot detection of the actual device, then the method continues at step 314, 316 with calibration of the hot spot detector. For example, continuing the surface variation example, if the hot spot detector predicts a surface variation of 15 mm, but the AFM analysis reveals a 25 mm surface variation, then the hot spot detector must be calibrated accordingly.

Step 314 represents a first method of calibrating the hot spot detector. In step 314 the parameters and/or logic of the hot spot detector is adjusted so as to match the hot spots detected on the actual device. It is understood, that numerous hot spot parameters may be analyzed in an effort to calibrate the hot spot detector in this manner. In that regard, a calibration circuit layout or other test circuit with a plurality of known hot spots may be used to calibrate the hot spot detector. After calibration of the hot spot detector, the method continues at step 312 with the implementation of the hot spot detector.

Step 316 represents a second method of calibrating the hot spot detector. In step 316 the parameters and/or logic of the hot spot detector is adjusted so as to match the hot spots detected on the actual device. It is understood, that numerous hot spot parameters may be analyzed in an effort to calibrate the hot spot detector in this manner. In that regard, a calibration circuit layout or other test circuit with a plurality of known hot spots may be used to calibrate the hot spot detector. In a similar manner, a plurality of calibration circuit layouts or test circuits with known hot spots may be used to calibrate the hot spot detector. After calibration of the hot spot detector, the method continues at step 304 where the hot spot detector performs a hot spot prediction/detection on the input file based on the recalibrated hot spot detection parameters.

Then the method 300 continues at step 310 where the hot spot prediction of the input file is compared to the hot spot detection of the actual device to determine whether the hot spot detector is consistent with the actual processing. In that regard, a new device may be manufactured for comparison or the actual device manufactured during the first comparison may be utilized again. If the hot spot prediction of the input file is consistent with the hot spot detection of the actual device, then the method continues at step 312 with implementation of the hot spot detection and correction system. However, if the hot spot prediction of the input file is inconsistent with the hot spot detection of the actual device, then the method continues at step 316 with calibration of the hot spot detector, as described above. This process can be iterated until the hot spot detector is appropriately calibrated to be consistent with the hot spots of the manufactured device(s). After the hot spot detector is calibrated so that the predicted hot spots are consistent with the detected hot spots of the actual device, then the method continues at step 312 with the implementation of the hot spot detection and correction system.

In some embodiments, the present disclosure is directed towards a system and method for identifying and correcting hot spots of a semiconductor device, including hot spots caused by dishing, erosion, bridging, pinching, and other hot spots. In particular, in some embodiments the system and method are adapted to reduce the cost and time required to produce a semiconductor device with the desired properties by identifying and correcting hot spots during the design and simulation phases, rather than after wafer processing. Some embodiments of the system and method are for use in design for manufacture (DFM) applications. Further, in some embodiments the present disclosure detects and corrects hot spots within local regions of a device. Detecting and correcting hot spots by separating a semiconductor into a plurality of local regions can increase the processing speed and reduce the required computer processing and memory power necessary for the analysis of the global design layout. By analyzing and correcting the hot spots of each of the local regions, the hot spots of the global design layout are remedied. Again, the methods described herein may be used on a single layer, a plurality of layers, and/or all of the layers of a chip design. In addition, the methods described herein may be used for detecting hot spots due to the interaction between the layers and/or the processes used to manufacture the device, such as ECP, CMP, and etching, for example.

Figure 10:
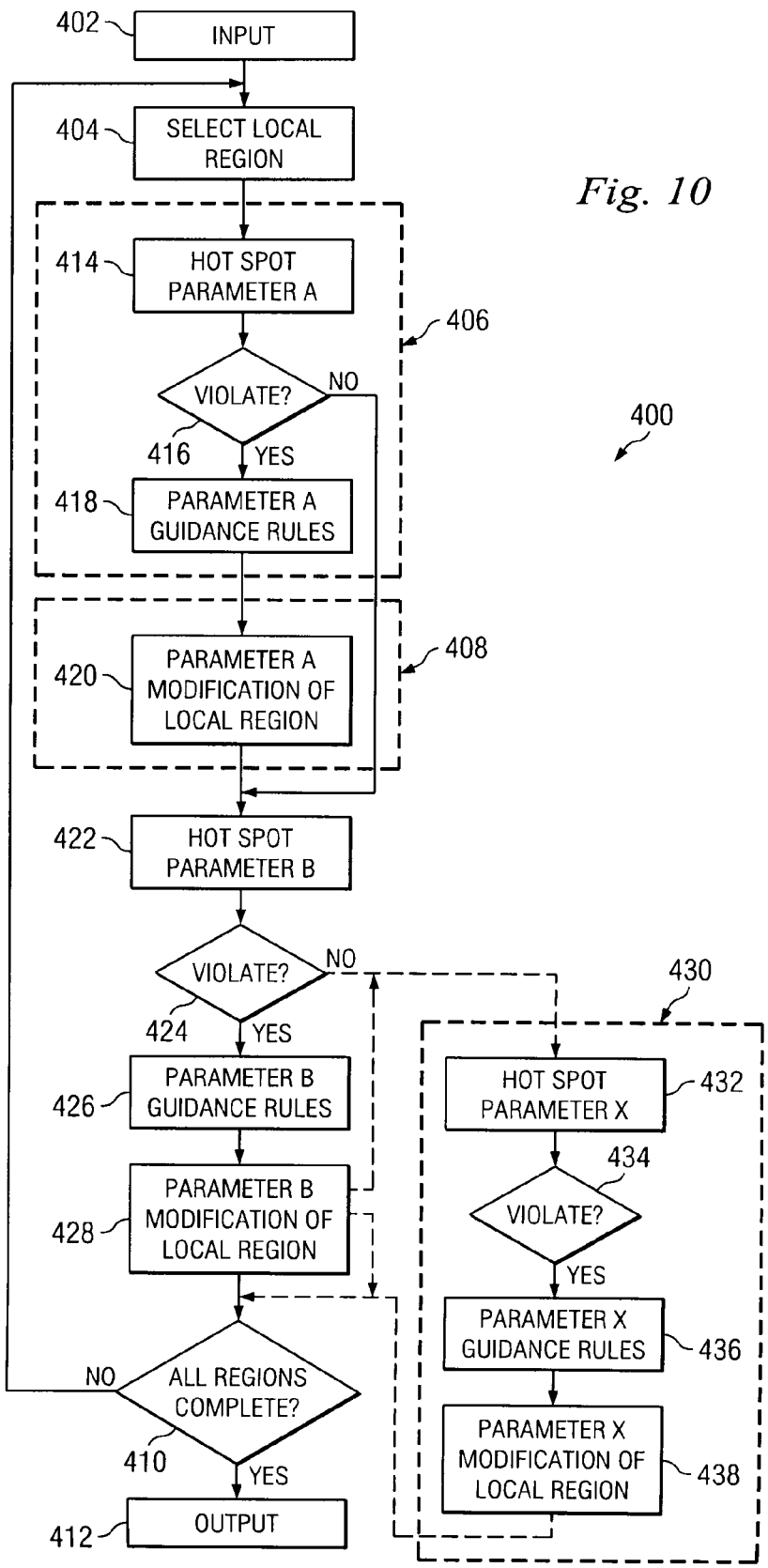
FIG. 10 is a block diagram of an exemplary embodiment of a method similar to the method of FIG. 9.

FIGS. 9 and 10 are block diagrams illustrating additional embodiments of the present disclosure. FIG. 9 is a block diagram of an embodiment of a method 400 according to one aspect of the present disclosure for detecting and correcting hot spots of a semiconductor device. The method 400 begins with step 402 in which an input file is provided. The input file is a circuit layout or chip design and in some embodiments is retrieved from a design database. The circuit layout is provided in a computer aided design format, such as GDS II format. In some embodiments, the circuit layout is generated by a virtual process simulator, such as a VCMP or other process simulation tool. Typically, the circuit layout includes a plurality of metal layers. Each metal layer includes metal interconnects disposed in a dielectric layer. The metal layers of the circuit layout are divided into a plurality of regions (also known as cells, grids, or tiles). It is understood that the number of regions can vary depending on the technology and the complexity of the circuit design. Again, the methods described herein may be used on a single layer, a plurality of layers, and/or all of the layers of a chip design. In addition, the methods described herein may be used for detecting hot spots due to the interaction between the layers and/or the processes used to manufacture the device, such as ECP, CMP, and etching, for example.

The method 400 continues with step 404 in which a local region is selected for analysis. The method 400 continues with step 406 in which a hot spot detector performs a hot spot detection on the input file. The hot spot detector is a software tool that determines whether the selected local region of the input file complies with a set of hot spot rules. The hot spot detector compares the parameters of the local region with a plurality of hot spot rules and/or specifications from a hot spot rules database. The hot spot detector determines whether the input file violates any of the plurality of hot spot rules. If the hot spot detector determines that the local region of the input file violates at least one of the hot spot rules, then the method 400 continues to step 408 in which the local region is modified to avoid violation of the hot spot rule(s). In some embodiments, the modification is based on a set of guidance parameters and/or rules based on the hot spot rule that was violated. As described above with respect to method 200, the suggested modifications based on the guidance parameters may be made to the input file by a computer system or program and/or directly by a user. On the other hand, if the hot spot detector determines that the local region of the input file satisfies the all of the hot spot rules, then no modifications are made to the region.

After the local region has been modified and/or the local region does not violate any of the hot spot rules, then the method 400 continues at step 410 where it is determined whether all of the local regions of the input file have been analyzed by the hot spot detector. If all of the local regions have been analyzed and determined to satisfy the hot spot rules, then the method 400 continues to step 412 in which an output file is output by the system. The output file is optimized for device manufacture as it does not violate any of the hot spot rules. In some embodiments, the output file is subjected to further rule-based testing or otherwise modified or tested to further improve the design and/or layout of the device before the manufacturing phase. On the other hand, if not all of the local regions have been analyzed, then the method 400 returns to step 404 and another local region is selected. The method 400 continues this iterative loop until all of the local regions of the input file have been subjected to hot spot detection. Once all of the local regions have been analyzed and determined to satisfy the hot spot rules, then the method 400 continues to step 412 in which the output file is output by the system.

FIG. 10 is a block diagram of an embodiment of the method 400 according to one aspect of the present disclosure for detecting and correcting hot spots of a semiconductor device. In particular, the block diagram of FIG. 10 illustrates an exemplary embodiment of the interaction of steps 406 and 408 within the method 400, which will now be discussed in greater detail. Step 406 begins with step 414 in which the spot detector testing the selected local region for a violation of hot spot parameter A. Hot spot parameter A is intended to represent any hot spot rule, parameter, or specification. However, for the sake of example a particular rule will now be discussed. In one embodiment, hot spot parameter A is a local maximum metal density. Each region of a metal layer has a local density associated with it. The local density for a given region is the total area of the interconnects located in the region divided by the total area of that region. The maximum density rule requires that each region have a local density equal to or less than a maximum density value, such as 90% for example. Thus, at step 416 the hot spot detector compares the density of the selected local region with the maximum density value to determine compliance with the rule.

If the selected local region violates the hot spot parameter A, then the method 400 continues to step 418 where a set of guidance rules related to hot spot parameter A are provided. The guidance rules provide suggestions for possible solutions to the detected hot spot(s). Thus, continuing the maximum density example from above, the guidance rules might include such suggestions as: (1) Add oxide slot in wide metal areas; (2) Separate wide metal line into several narrower lines; (3) Remove narrow metal lines from upper metal layers that cross wide metal areas; and/or (4) Other appropriate rule suggestions. Then the method 400 continues to step 420 where the selected local region is modified based on the guidance rules and/or other specifications in an effort to comply with hot spot parameter A. After the selected local region has been modified, the method 400 continues to step 422 in which the spot detector tests the selected local region for a violation of hot spot parameter B. On the other hand, if the selected local region does not violate the hot spot parameter A, then no modifications are made and the method 400 continues directly to step 422.

Step 422 comprises the hot spot detector testing the selected local region for a violation of hot spot parameter B. Hot spot parameter B is intended to represent any hot spot rule, parameter, or specification. However, for the sake of example a particular rule will now be discussed. In one embodiment, hot spot parameter B is a minimum line spacing between wide metal lines. The minimum line spacing rule(s) require that metal lines of a certain width have a certain amount of spacing between them. If the metal lines do not have sufficient spacing then minimum line spacing rule is violated. For example, the minimum line spacing rule might specify that lines having a width between 1.5-4.5 μm have a spacing of at least 0.5 μm and lines having a width greater than 4.5 μm have a spacing of at least 1.5 μm. Thus, at step 424 the hot spot detector compares the spacing of the metal lines of the selected local region with the minimum line spacing rule(s) to determine compliance with the rule.

If the selected local region violates the hot spot parameter B, then the method 400 continues to step 426 where a set of guidance rules related to hot spot parameter B are provided. The guidance rules provide suggestions for possible solutions to the detected hot spot(s). Thus, continuing the minimum line spacing rule example from above, the guidance rules might include such suggestions as: (1) Increase spacing of lines having a width between 1.5-4.5 μm to at least 0.5 μm; (2) Increase spacing of lines having a width greater than 4.5 μm to at least 1.5 μm; (3) Remove metal lines in upper metal layers that cross wide metal areas; and/or (4) Other appropriate rule suggestions. Then the method 400 continues to step 428 where the selected local region is modified based on the guidance rules and/or other specifications in an effort to comply with hot spot parameter B. After the selected local region has been modified, the method 400 continues to step 430 in which the spot detector tests the selected local region for a violation of the remaining hot spot parameters. On the other hand, if the selected local region does not violate the hot spot parameter B, then no modifications are made and the method 400 continues directly to step 430.

Step 430 and hot spot parameter X represent generically the hot spot detection and modification of the selected local region based on any remaining hot spot parameters. In this regard, the method 400 may include a single hot spot parameter or a plurality of hot spot parameters. The hot spot parameters that are checked may be selected based on the processing techniques, feature size, and/or other attributes of the design layout and/or manufacturing process. Step 432 comprises the hot spot detector testing the selected local region for a violation of hot spot parameter X. Again, hot spot parameter X is intended to represent any single or plurality of remaining hot spot rules, parameters, or specifications. However, for the sake of example a particular hot spot parameter will now be discussed. In one embodiment, hot spot parameter X is a maximum metal density deviation between adjacent local regions. The maximum metal density deviation rule requires that adjacent local regions have a metal density within a certain range of one another. If the metal density between two adjacent regions is greater than the maximum deviation allowed by the parameter then the hot spot rule is violated. Thus, at step 434 the hot spot detector compares the spacing of the metal lines of the selected local region with the minimum line spacing rule(s) to determine compliance with the rule.

If the selected local region violates the hot spot parameter X, then the method 400 continues to step 436 where a set of guidance rules related to hot spot parameter X are provided. The guidance rules provide suggestions for possible solutions to the detected hot spot(s). Thus, continuing the maximum metal density deviation example from above, the guidance rules might include such suggestions as: (1) Insert dummy metal into isolation region; (2) Separate wide metal line into several narrower lines; (3) Add oxide slot in wide metal areas; (4) Reduce the metal density deviation to less than 15%; and/or (5) Other appropriate rule suggestions. Then the method 400 continues to step 438 where the selected local region is modified based on the guidance rules and/or other specifications in an effort to comply with hot spot parameter A. After the selected local region has been modified or if the local region initially satisfies hot spot parameter X, the method 400 continues testing the selected local region for violations of any remaining hot spot parameters.

Once all of the hot spot parameters have been tested and corresponding modifications have been suggested/made, then the method continues to step 410 where it is determined whether all of the local regions of the input file have been analyzed by the hot spot detector. If all of the local regions have been analyzed and determined to satisfy the hot spot rules, then the method 400 continues on to step 412 where the output file is output by the system. On the other hand, if not all of the local regions have been analyzed, then the method 400 returns to step 404 and another local region is selected. The method 400 continues this iterative loop until all of the local regions of the input file have been subjected to hot spot detection. Once all of the local regions have been analyzed and determined to satisfy the hot spot rules, then the method 400 continues to step 412 in which the output file is output by the system.

In the illustrated embodiment, the hot spot detection of step 406 is carried out in successive steps based on the various hot spot parameters A, B, . . . , X. In other embodiments, however, the hot spot detection of the various hot spot parameters are carried out simultaneously. In some embodiments, the hot spot detection is carried out in a user-defined sequence. The user-defined sequence may be limited to specific region(s), simulation efficiencies, and combinations thereof. Further, in the described embodiment the circuit layout is only tested based on a single division of the layout into local regions. However in other embodiments, the device layout is organized by more than one local regions layout having different boundaries. The hot spot detection and modification steps of the method can then be repeated for the different local region divisions. Dividing the layout into different regional patterns can alleviate the potential for hot spots being missed or undetected due to the division of the layout. For example, in one division a high density metal area indicative of a potential hot spot could be divided roughly in half by the regional pattern to create two areas with moderately high metal density satisfying the hot spot parameters, but in the second division the high density metal area may be found in a single region and the hot spot parameter of maximum local metal density would be violated.

In some embodiments, the present disclosure is directed towards a system and method for routing a circuit design in an effort to avoid and/or correct any potential hot spots of a semiconductor device, including hot spots caused by dishing, erosion, bridging, pinching, and other hot spots. In particular, in some embodiments the system and method are adapted to reduce the cost and time required to produce a semiconductor device with the desired properties by identifying and correcting any potential hot spots during the design and simulation phases, rather than after wafer processing. Some embodiments of the system and method are for use in design for manufacture (DFM) applications. Some embodiments of the system and method are utilized in a router or routing system.

In some embodiments the present disclosure corrects hot spots within local regions of a device layout. Correcting hot spots by separating a semiconductor layout into a plurality of local regions can increase the processing speed and reduce the required computer processing and memory power necessary for the elimination of hot spots from the entire design layout. Then by correcting the hot spots of each of the local regions, the hot spots of the global design layout are also remedied. In some embodiments, the present disclosure corrects hot spots on the global design layout level. In some embodiments, the present disclosure corrects hot spots on both local regions and the global design layout. Again, the methods described herein may be used on a single layer, a plurality of layers, and/or all of the layers of a chip design. In addition, the methods described herein may be used for correcting hot spots due to the interaction between the layers and/or the processes used to manufacture the device.

Figure 11:
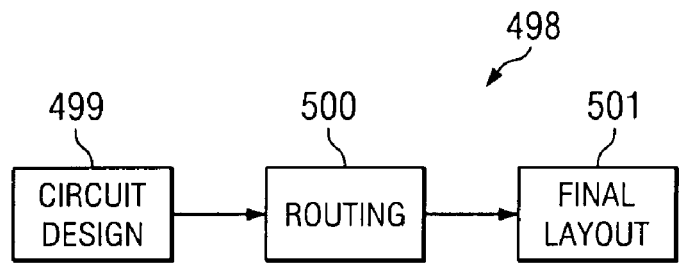
FIG. 11 is a block diagram of an embodiment of a method according to one aspect of the present disclosure for creating a final layout from a circuit design.

FIG. 11 is a block diagram of an embodiment of a method 498 according to one aspect of the present disclosure for creating a final layout from a circuit design. In particular, the method 498 begins at step 499 where a circuit design is provided. The method 498 continues at step 500 with the routing of the circuit design by a router. As with other embodiments of the present disclosure, the circuit design is often provided in a computer aided design format, such as GDS II for example. As described more fully below, the routing of the circuit design is performed in such a way as to greatly reduce and/or eliminate the existence of any hot spots on the final circuit design layout. The method 498 concludes at step 501 with the output of a final layout of the circuit design taking into account any corrections and/or changes made during the routing process to avoid the presence of hot spots.

Figure 12:
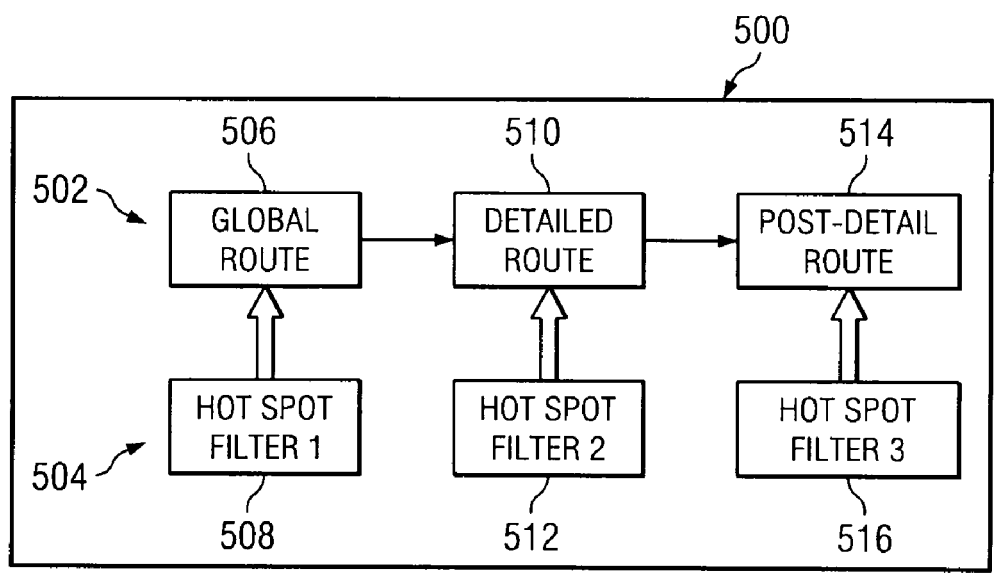
FIG. 12 is a block diagram of an exemplary embodiment of a method of performing the routing step of the method of FIG. 11.

FIG. 12 is a block diagram of an embodiment of a method of performing the routing step 500 of the method 498 of FIG. 11. The method 500 according to this aspect of the present disclosure is for routing the design layout of a semiconductor device to avoid hot spots. The method 500 includes a routing process 502 and a hot spot filtering process 504. Each of the steps of the routing process 502 is subjected to a corresponding hot spot filter of the hot spot filtering process 504. Step 506 of the routing process is a global or chip-wide routing. Step 506 provides the general layout for the device from which all modifications will be made. A first hot spot filter 508 from the filtering process 504 is applied to step 506. The first hot spot filter 508 defines a first set of hot spot rules that the global routing must comply with. The specific rules of the hot spot filter 508 may be selected based on the desired design layout, the features sizes, the processing techniques, the desired properties (e.g., timing), and/or any other features of the device or manufacturing process.

In at least one embodiment, the first hot spot filter 508 is the most pessimistic of all of the hot spot filters. For example, the hot spot filter 508 may assume that where the global routing could route the lines, vias, layers, or other features in such a way to create a hot spot, that the global routing will route the lines, vias, layers, or other features in that way. Thus, when the global routing provides such a suggested route, the hot spot filter 508 would detect the potential hot spot and communicate to the router to use an alternative route. The hot spot filter 508 may analyze the suggested global layout both sequentially (one line, via, layer, or other feature at a time) and concurrently (considering multiple lines, vias, layers, or other features simultaneously). The first hot spot filter 508 also focuses on optimizing the objectives of the device. For example, the hot spot filter 508 may monitor that timing of sequential events is within the desired range. Where the objectives of the device are not being met, the hot spot filter 508 will communicate to the router to use an alternative route. In some embodiments, the hot spot filter 508 itself is adapted to reroute the device layout to correspond with its rules.

The routing process 502 continues with step 510. Step 510 is a detailed routing that provides an initial detailed layout for the device, including the proposed locations of all lines, vias, layers, and other features. A second hot spot filter 512 from the filtering process 504 is applied to step 510. The second hot spot filter 512 defines a second set of hot spot rules that the detailed routing must comply with. In some embodiments, the second hot spot filter is less pessimistic than the first hot spot filter 508 and provides a more accurate analysis of where hot spots are likely based on the layout. In some embodiments, the second hot spot filter considers each line, via, layer, or feature of the layout sequentially in an effort to detect potential hot spots. Again, the hot spot filter 512 will communicate to the router to use an alternative route and/or reroute the device layout itself to correspond when its hot spot rules are violated.

The routing process 502 continues with step 514. Step 514 is a post-detailed routing that provides the detailed layout for the device after modification based on the second hot spot filter. While the vast majority of hot spots will be detected and eliminated after the global and detailed routing have been subjected to the first and second hot spot filters, some hot spots may still exist due to the specific layout. Thus, a third hot spot filter 516 from the filtering process 504 is applied to step 514. The third hot spot filter 514 defines a third set of hot spot rules that the post-detailed routing must comply with. In some embodiments, the third hot spot filter is less pessimistic and more realistic in its rules than both the first and second hot spot filters. In that regard, in some embodiments the hot spot filter includes a hot spot detector adapted to detect only existing hot spots not simply potential hot spots. Any portions of the layout that violate the rules of the third hot spot filter will be subjected to rerouting. In some embodiments, this reroute is performed manually by a rip-up and re-route technique. In other embodiments, the reroute is again performed by the routing system and/or the hot spot filter. The rerouting may be based on hot spot rules of the third hot spot filter and/or based on more stringent hot spot design rules. After this rerouting all of the hot spots should be eliminated from the device layout. The hotspot-free layout is the final layout.

Though the hot spot filters have been described as having different rules/definitions, in other embodiments the same hot spot filter may be used at. Further, the particular hot spot filter used for a certain step of the routing process may be selected based on the design layout, the features sizes, the processing techniques, or other reasons. A plurality of hot spot filter definitions may be stored in a database for use in the method.

In some embodiments, a step of the routing process may not be subjected to hot spot filtering. Further, in other embodiments the routing process 502 may include additional or fewer steps.

Figure 13:
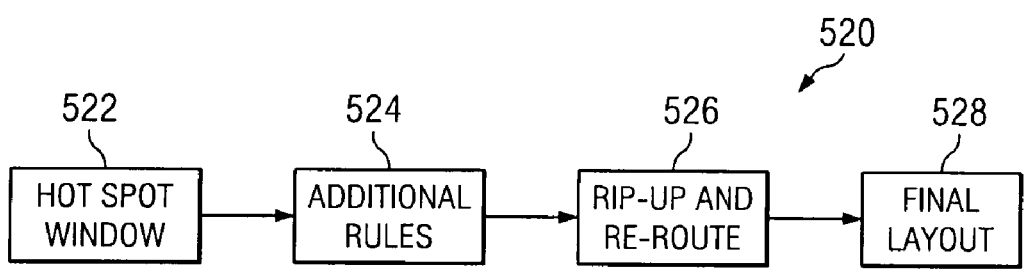
FIG. 13 is a block diagram of an embodiment of a method according to one aspect of the present disclosure for modifying a circuit design to create a hotspot-free final layout.

FIG. 13 is a block diagram of an embodiment of a method 520 according to one aspect of the present disclosure for modifying a circuit design to create a hotspot-free final layout. In some embodiments, the method 520 may be used as part of the rerouting process associated with the third hot spot filter 516 in the method 500 above. Similarly, in some embodiments the method 520 is used as part of the modification process of any of the hot spot filters.

The method 520 begins with step 522 where a hot spot window is defined. The hot spot window is an area surrounding a potential or detected hot spot. The size of the hot spot window will vary depending on the nature of the hot spot detected. In most cases, the hot spot window is of sufficient size to include all of the affected lines, vias, and features that attribute to the hot spot. Once the hot spot window has been defined at step 522, the method 520 continues with step 524 where a set of additional hot spot rules are applied to the hot spot window. In some embodiments, the additional hot spot rules are more stringent than previously applied hot spot rules. Then based on the additional hot spot rules, the method 520 continues to step 526 with the rip-up and rerouting of the affected lines, vias, and other features within the hot spot window.

The rip-up and rerouting is limited to the hot spot window to avoid the potential creation of hot spots in other areas of the device layout outside of the hot spot window. In that regard, in some embodiments the additional hot spot rules prevent any vias from being moved, requiring other modifications to avoid the hot spot problems. In other embodiments, the additional hot spot rules will allow a via to be moved, but only if it can be moved such that no other layers are affected and/or need to be rerouted due to moving the via. In some embodiments, the hot spot rules will define a routing blockage adjacent the predicted or detected hot spot. The routing blockage may have a fixed or configurable size. The size of the routing blockage may be adapted for the size and/or location of the hot spot. Any wire or feature must be rerouted around the blockage in an effort to eliminate the hot spot. After the rip-up and rerouting, any previously existing or detected hot spots should be eliminated. If multiple hot spots were detected in different areas of the device, then multiple hot spot windows will be defined and the lines, vias, and features of each hot spot window will be subjected to the rip-up and reroute to eliminate any hot spot issues. Once all of the hot spot windows have been ripped-up and rerouted, the method 520 continues to step 528 where the final layout is output.

Figure 14:
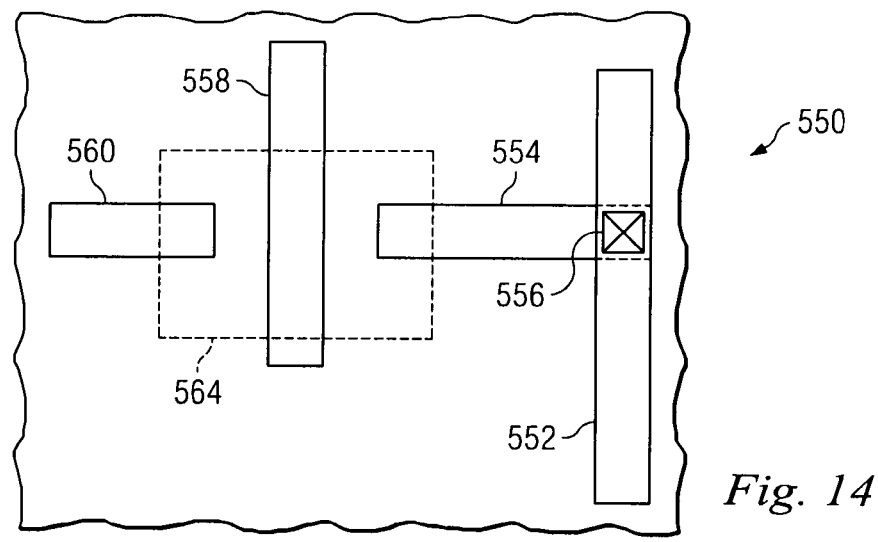
FIG. 14 is a top-down view of a portion of a semiconductor wafer.
Figure 15:
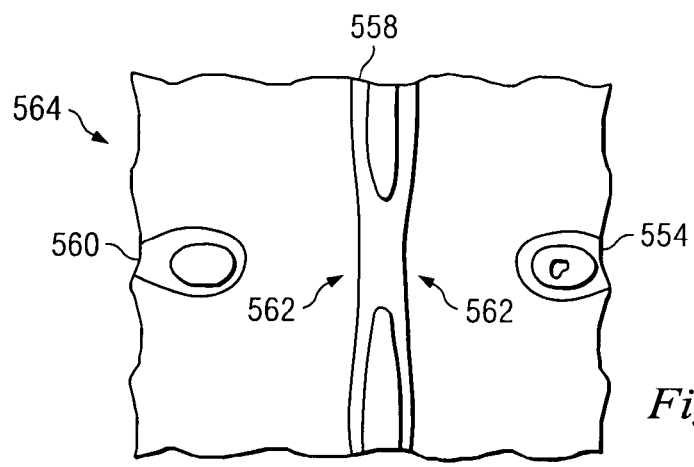
FIG. 15 is an alternative top-down view of a section of the portion of the semiconductor of FIG. 14.

FIGS. 14 and 15 are top-down views of a portion of a semiconductor wafer 550 subject to at least one of the methods described above. As shown, the portion 550 includes a wire 552 and a wire 554. A via 556 connects the wire 552 to the wire 556. The portion 550 also includes a wire 558 spaced from and extending substantially perpendicular to wire 554. The portion 550 also includes a wire 560 spaced from and extending substantially perpendicular to wire 558. In the current embodiment, the wire 560 is substantially parallel and aligned with the wire 554. As shown more clearly in FIG. 15, the routing of the wires 554, 558, 560 results in a hot spot 562. The hot spot 562 is shown as a pinching effect, but in other instances may be any other type of hot spot. Referring again to both FIGS. 14 and 15, a hot spot window 564 is defined around the hot spot 562. In some embodiments, the wires 554, 558, and 560 are then ripped up and rerouted within the hot spot window 564, for example as described in method 520 above.

Figure 16:
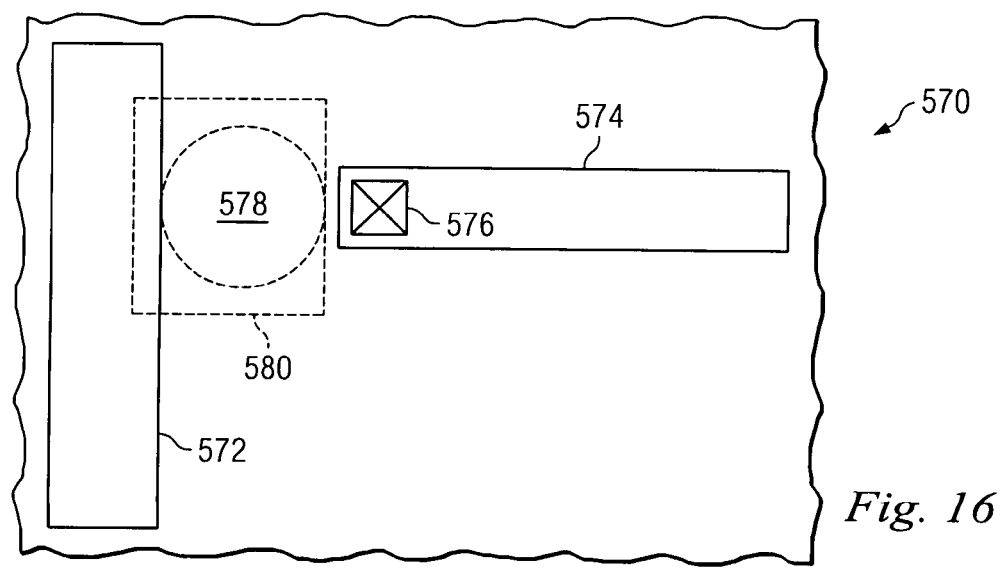
FIG. 16 is a top-down view of a portion of a semiconductor wafer.
Figure 17:
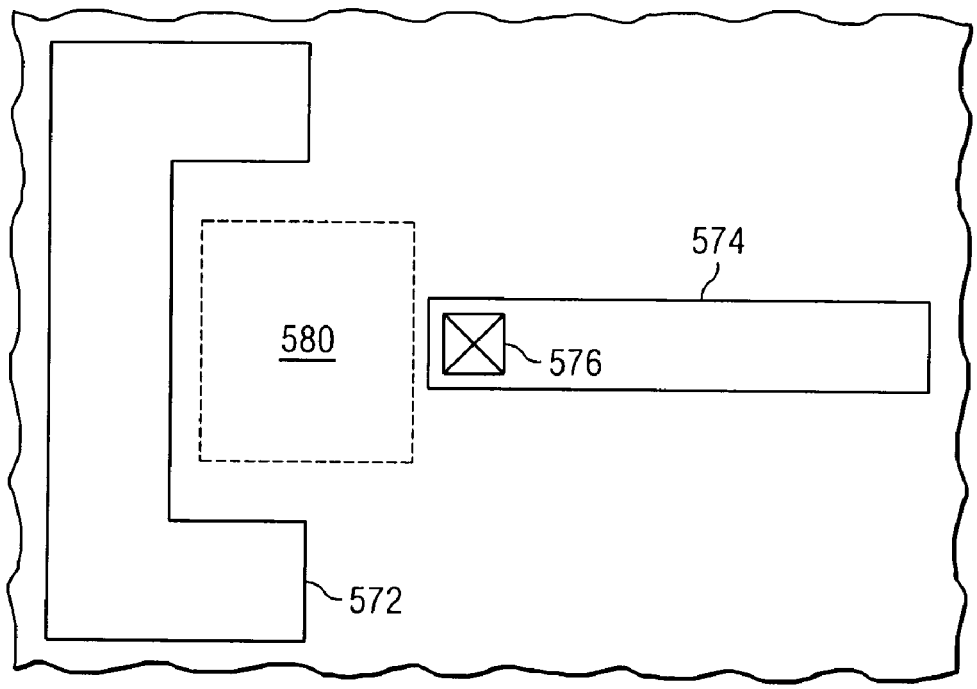
FIG. 17 is a top-down view of the portion of the semiconductor wafer of FIG. 16 after rerouting according to a method of one aspect of the present disclosure.

FIGS. 16 and 17 are top-down views of a portion of a semiconductor wafer 570 subject to at least one of the methods described above. FIG. 17 shows the portion of the semiconductor wafer 570 after rerouting according to one of the methods described above. As shown in FIG. 16, the portion 570 includes a wire 572 and a wire 574. A via 576 connects the wire 552 to the other wires (not shown). As shown, the routing of the wires 572, 574 results in a hot spot 578. The hot spot 578 is shown generally and may represent any type of hot spot. A hot spot blockage 580 is defined around the hot spot 578. In some embodiments, the wire 572 is then ripped up and rerouted to avoid the hot spot blockage 580, as shown in FIG. 17 and described above with respect to method 520.

Figure 18:
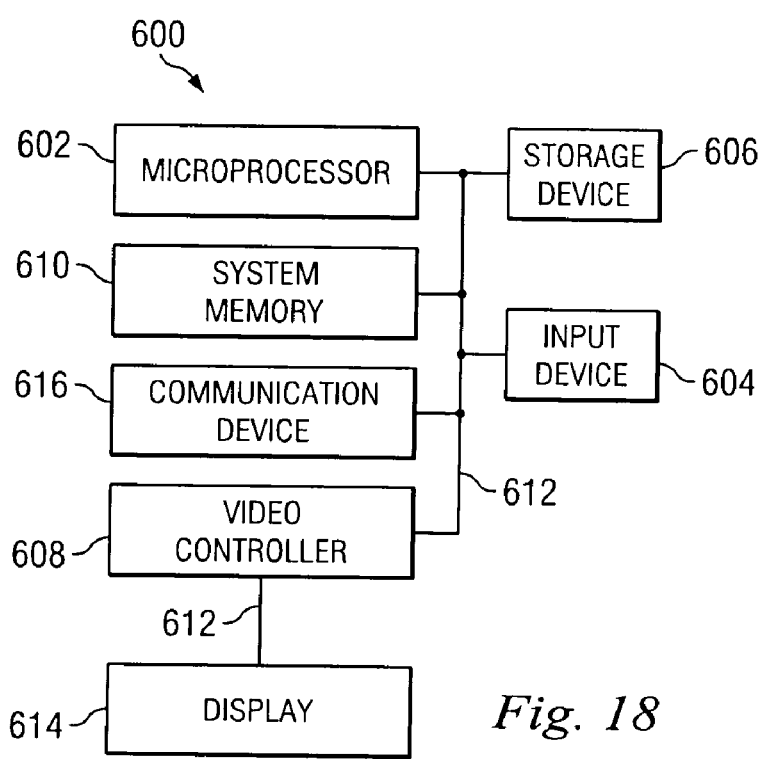
FIG. 18 is a diagrammatic view of a node for implementing various embodiments of the methods of the present disclosure.

Referring now to FIG. 18, shown therein is an illustrative node 600 for implementing embodiments of the methods described above. Node 600 includes a microprocessor 602, an input device 604, a storage device 606, a video controller 608, a system memory 610, and a display 614, and a communication device 616 all interconnected by one or more buses 612. The storage device 606 could be a floppy drive, hard drive, CD-ROM, optical drive, or any other form of storage device. In addition, the storage device 606 may be capable of receiving a floppy disk, CD-ROM, DVD-ROM, or any other form of computer-readable medium that may contain computer-executable instructions. Further communication device 616 could be a modem, network card, or any other device to enable the node to communicate with other nodes. It is understood that any node could represent a plurality of interconnected (whether by intranet or Internet) computer systems, including without limitation, personal computers, mainframes, PDAs, and cell phones.

A computer system typically includes at least hardware capable of executing machine readable instructions, as well as the software for executing acts (typically machine-readable instructions) that produce a desired result. In addition, a computer system may include hybrids of hardware and software, as well as computer sub-systems.

Hardware generally includes at least processor-capable platforms, such as client-machines (also known as personal computers or servers), and hand-held processing devices (such as smart phones, personal digital assistants (PDAs), or personal computing devices (PCDs), for example). Further, hardware may include any physical device that is capable of storing machine-readable instructions, such as memory or other data storage devices. Other forms of hardware include hardware sub-systems, including transfer devices such as modems, modem cards, ports, and port cards, for example.

Software includes any machine code stored in any memory medium, such as RAM or ROM, and machine code stored on other devices (such as floppy disks, flash memory, or a CD ROM, for example). Software may include source or object code, for example. In addition, software encompasses any set of instructions capable of being executed in a client machine or server.

Combinations of software and hardware could also be used for providing enhanced functionality and performance for certain embodiments of the present disclosure. One example is to directly manufacture software functions into a silicon chip. Accordingly, it should be understood that combinations of hardware and software are also included within the definition of a computer system and are thus envisioned by the present disclosure as possible equivalent structures and equivalent methods.

Computer-readable mediums include passive data storage, such as a random access memory (RAM) as well as semi-permanent data storage such as a compact disk read only memory (CD-ROM). In addition, an embodiment of the present disclosure may be embodied in the RAM of a computer to transform a standard computer into a new specific computing machine.

Data structures are defined organizations of data that may enable an embodiment of the present disclosure. For example, a data structure may provide an organization of data, or an organization of executable code. Data signals could be carried across transmission mediums and store and transport various data structures, and, thus, may be used to transport an embodiment of the present disclosure.

The system may be designed to work on any specific architecture. For example, the system may be executed on a single computer, local area networks, client-server networks, wide area networks, internets, hand-held and other portable and wireless devices and networks.

A database may be any standard or proprietary database software, such as Oracle, Microsoft Access, SyBase, or DBase II, for example. The database may have fields, records, data, and other database elements that may be associated through database specific software. Additionally, data may be mapped. Mapping is the process of associating one data entry with another data entry. For example, the data contained in the location of a character file can be mapped to a field in a second table. The physical location of the database is not limiting, and the database may be distributed. For example, the database may exist remotely from the server, and run on a separate platform. Further, the database may be accessible across the Internet. Note that more than one database may be implemented.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. It is understood that various different combinations of the above-listed processing steps can be used in combination or in parallel. Also, features illustrated and discussed above with respect to some embodiments can be combined with features illustrated and discussed above with respect to other embodiments. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:

providing an input file in an electronic format in a computer readable medium, wherein the input file comprises a device layout;

fabricating a semiconductor device corresponding to the device layout of the input file;

performing a first hot spot detection, using a first hot spot detection machine, on the input file to detect a hot spot in the device layout of the input file;

performing a second hot spot detection, using a second hot spot detection machine, on the semiconductor device to detect a hot spot in the semiconductor device; and comparing the hot spots detected by the first and second hot spot detections in order for:

modifying the device layout of the input file based on the first hot spot detection when the hot spot is detected in the device layout to create an output file if the hot spots detected by the first and second hot spot detections are consistent with respect to each other, and calibrating the first hot spot detection to correspond to the hot spot detected by the second hot spot detection when the hot spots detected by the first and second hot spot detections are inconsistent with respect to each other.

2. The method of claim 1, wherein the performing a first hot spot detection comprises comparing at least one parameter of the device layout to at least one of a plurality of hot spot rules to determine if the at least one hot spot rule is violated.

3. The method of claim 2, wherein the plurality of hot spot rules are stored in a hot spot rules database.

4. The method of claim 3, wherein the performing a first hot spot detection is performed by a hot spot detector, the hot spot detector in communication with the hot spot rules database.

5. The method of claim 4, wherein the modifying the device layout is performed at least partially using a computer-aided system.

6. The method of claim 5, wherein the modifying the device layout is based on a set of modification guidance parameters.

7. The method of claim 6, wherein the modification guidance parameters are based upon the at least one hot spot rule that is violated.

8. The method of claim 7, wherein the input file and the output file are in a computer-aided design format.

9. The method of claim 2, wherein the calibrating comprises calibrating the plurality of hot spot rules.

10. The method of claim 9, wherein the calibrating the plurality of hot spot rules comprises comparing the first hot spot detection based on the plurality of hot spot rules to the hot spots detected by the second hot spot detection on the semiconductor device being a test wafer and modifying the hot spot rules such that the first hot spot detection and the second hot spot detection are consistent with respect to each other.

11. A method comprising:
providing an input file in an electronic format in a computer readable medium, wherein the input file comprises a device layout having a plurality of local regions;
selecting at least one local region from the plurality of local regions of the device layout until all of the plurality of local regions of the device layout have been selected;
performing first hot spot detections, using a first hot spot detection machine, on each one of the local regions based on a plurality of hot spot rules to detect hot spots in each one of the local regions of the device layout, wherein at least one of the hot spot rules corresponds to determining a pattern density of each one of the local regions exceeding a predetermined threshold;
modifying each one of the local regions of the device layout based on the first hot spot detected to create an output file;
fabricating a semiconductor device corresponding to the output file;
performing second hot spot detections, using a second hot spot detection machine, on the semiconductor devices;

tuning the first hot spot detection machine and generating a modified output file in response to the second hot spot detections; and fabricating another semiconductor device using the modified output file.

12. The method of claim 11, wherein the performing first hot spot detections comprises comparing at least one parameter of each one of the local regions of the device layout to at least one of the plurality of hot spot rules to determine if the at least one hot spot rule is violated.

13. The method of claim 12, wherein the modifying each one of the local regions of the device layout is performed at least partially using a computer-aided system.

14. The method of claim 13, wherein the modifying each one of the local regions of the device layout is based on a set of modification guidance parameters.

15. The method of claim 14, wherein the modification guidance parameters are based upon the at least one hot spot rule that is violated.

16. The method of claim 11, wherein the pattern density represents an area occupied by interconnects within each one of the local regions divided by a total area occupied by each one of the local regions.

17. The method of claim 16, wherein the predetermined threshold is about 90%.

18. A method comprising:
providing an input file including a device layout;
fabricating a test semiconductor device corresponding to the device layout of the input file;
comparing by a first hot spot detector at least one parameter of the device layout to at least one of a plurality of hot spot rules to determine if the at least one hot spot rule is violated by the at least one parameter of the device layout;
comparing by a second hot spot detector at least one parameter of the test semiconductor device to the at least one of the plurality of hot spot rules to determine if the at least one hot spot rule is violated by the at least one parameter of the test semiconductor device, wherein the at least one parameter of the test semiconductor device is substantially the same as the at least one parameter of the device layout;
modifying the device layout of the input file when the at least one parameter of the device layout and the at least one parameter of the test semiconductor device both violate the at least one hot spot rule to avoid violating the at least one hot spot rule, wherein the device layout is modified based upon a plurality of modification guidance parameters that are associated with the plurality of hot spot rules;
creating an output file based on the modified device layout; and
fabricating a production semiconductor device corresponding to the output file.

19. The method of claim 18, wherein the input file and the output file are in a computer aided design format and wherein the modifying the device layout is performed at least partially using a computer-aided system.

* * * * *